(12) United States Patent
Kondo

(10) Patent No.: US 10,074,545 B2
(45) Date of Patent: Sep. 11, 2018

(54) PLASMA PROCESSING APPARATUS AND PLASMA PROCESSING METHOD

(71) Applicant: TOKYO ELECTRON LIMITED, Tokyo (JP)

(72) Inventor: Takashi Kondo, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 15/124,589

(22) PCT Filed: Feb. 26, 2015

(86) PCT No.: PCT/JP2015/000997
§ 371 (c)(1),
(2) Date: Sep. 8, 2016

(87) PCT Pub. No.: WO2015/155923
PCT Pub. Date: Oct. 15, 2015

(65) Prior Publication Data
US 2017/0018407 A1    Jan. 19, 2017

(30) Foreign Application Priority Data

Apr. 9, 2014    (JP) .................................. 2014-079837

(51) Int. Cl.
*H01L 21/3213*    (2006.01)
*H01L 21/3065*    (2006.01)
(Continued)

(52) U.S. Cl.
CPC .... *H01L 21/32136* (2013.01); *H01J 37/3266* (2013.01); *H01J 37/32091* (2013.01);
(Continued)

(58) Field of Classification Search
None
See application file for complete search history.

(56) References Cited

U.S. PATENT DOCUMENTS

2013/0220547 A1*    8/2013    Nagaseki .......... H01J 37/32091
                                                   156/345.46

FOREIGN PATENT DOCUMENTS

CN        103247511 A        8/2013
JP        3-107481 A         5/1991
(Continued)

OTHER PUBLICATIONS

International Search Report dated May 19, 2015 in PCT/JP2015/000997.

*Primary Examiner* — Jiong-Ping Lu
(74) *Attorney, Agent, or Firm* — Rothwell, Figg, Ernst & Manbeck, P.C.

(57) ABSTRACT

Disclosed is a plasma processing apparatus for performing a processing on a processing target substrate by applying of plasma of a processing gas to the processing target substrate. The plasma processing apparatus includes: a processing container configured to removably accommodate the processing target substrate; a lower electrode provided in the processing container to place the processing target substrate thereon; an upper electrode provided in the processing container to face the lower electrode; a high frequency power source configured to apply a high frequency power between the upper electrode and the lower electrode; and an electromagnet having one or more annular coils around a central axis that passes through a center of the lower electrode vertically in an upper portion or at an upper side of the processing container.

6 Claims, 12 Drawing Sheets

(51) Int. Cl.
  *H01J 37/32* (2006.01)
  *H05H 1/46* (2006.01)
  *H01L 21/311* (2006.01)
  *H01L 21/67* (2006.01)
  *H01L 21/683* (2006.01)

(52) U.S. Cl.
  CPC .. *H01J 37/32568* (2013.01); *H01J 37/32642* (2013.01); *H01J 37/32669* (2013.01); *H01L 21/3065* (2013.01); *H01L 21/31116* (2013.01); *H01L 21/67069* (2013.01); *H01L 21/6831* (2013.01); *H05H 1/46* (2013.01); *H01J 2237/334* (2013.01); *H05H 2001/4667* (2013.01)

(56) References Cited

FOREIGN PATENT DOCUMENTS

| | | |
|---|---|---|
| JP | 5-267237 A | 10/1993 |
| JP | 2000-150472 A | 5/2000 |
| JP | 3037848 B2 | 5/2000 |
| JP | 3375302 B2 | 2/2003 |
| JP | 2004-303939 A | 10/2004 |
| JP | 2005-217240 A | 8/2005 |
| JP | 2005-527119 A | 9/2005 |
| JP | 2005-303099 A | 10/2005 |
| JP | 2006-332075 A | 12/2006 |
| JP | 2007-258417 A | 10/2007 |
| JP | 4107518 B2 | 6/2008 |
| JP | 2012-164766 A | 8/2012 |
| WO | 03/100818 A1 | 12/2003 |

* cited by examiner

PLASMA PROCESSING APPARATUS AND PLASMA PROCESSING METHOD

CROSS REFERENCE TO RELATED APPLICATION

This application is a 35 U.S.C. 371 National Phase Entry Application from PCT/JP2015/000997, filed Feb. 26, 2015, which claims priority to Japanese Patent Application No. 2014-079837, filed Apr. 9, 2014, the disclosures of which are incorporated herein in their entirety by reference.

TECHNICAL FIELD

The present disclosure relates to a capacitively coupled plasma processing apparatus and a plasma processing method.

BACKGROUND

In a manufacturing process of a semiconductor device, a plasma processing apparatus has been used which performs a processing (e.g., etching) on a processing target substrate (e.g., a semiconductor wafer) by applying plasma of a processing gas to the processing target substrate. Conventionally, a capacitively coupled plasma etching apparatus has been widely used for single wafer type plasma etching.

Generally, in the capacitively coupled plasma etching apparatus, an upper electrode and a lower electrode are disposed in parallel within a processing container configured as a vacuum chamber, a semiconductor wafer is placed on the upper electrode, and then, a high frequency power is applied between both electrodes. Then, plasma is generated by a high frequency discharge between both electrodes, so that an etching processing is performed on the surface of the substrate in a desired pattern by radicals or ions in the plasma.

Conventionally, in order to control a plasma density distribution mainly in the processing container, the capacitively coupled plasma etching apparatus includes a magnetic field forming mechanism that forms a magnetic field or a magnetic force line passing through a processing space in the processing container on a predetermined route.

For example, Patent Document 1 discloses a magnetic field forming mechanism configured to form a uniform horizontal magnetic field in a processing space within a processing container by arranging a plurality of dipole ring magnets each made of an anisotropic segment pillar magnet annularly around (outside) a sidewall of the processing container. Patent Document 2 discloses a magnetic field forming mechanism configured to form a uniform horizontal magnetic field in a processing space within a processing container by arranging, above a ceiling of the processing container, a rotary magnet having N and S poles sufficiently farther away from each other than a diameter size of a processing target substrate, and rotating the rotary magnet around a central axis of the processing container as a rotary center. Further, Patent Document 3 discloses a magnetic field forming mechanism configured to form a radial magnetic field in a processing space within a processing container by arranging a plurality of electromagnets each having N and S poles standing in a vertical direction.

PRIOR ART DOCUMENT

Patent Document

Patent Document 1: Japanese Patent No. 3375302
Patent Document 2: Japanese Patent No. 3037848
Patent Document 3: Japanese Patent No. 4107518

DISCLOSURE OF THE INVENTION

Problems to be Solved

In the manufacturing process of a semiconductor wafer, when an etching processing is performed on the semiconductor wafer with a high aspect ratio using the capacitively coupled plasma etching apparatus, especially, when forming a contact hole with a high aspect ratio, a phenomenon that the contact hole is inclined (tilting) may occurs in some regions in the plane of the wafer (e.g., a peripheral region of the wafer), which in turn causes a reduction in yield.

One of factors causing such tilting is that unevenness is generated in the interface between the ion sheath and the bulk plasma on the processing target substrate so that an inclined portion is generated in the interface near the boundary between the concave portion and the convex portion. That is, when the interface between the ion sheath and the bulk plasma is inclined, the angle of ions incident on the wafer in the vicinity thereof (incidence angle) is inclined diagonally rather than being vertical. Thus, so-called tilting is generated which causes an etching hole or etching trench to be inclined.

Specifically, in the processing container of the plasma processing apparatus, since the outer peripheral portion of the processing target substrate and a portion radially outward therefrom are different from each other in structure or material, a step or change is easily generated in the thickness of the ion sheath formed at an upper side. Thus, unevenness is easily generated in the interface between the ion sheath and the bulk plasma.

Further, in a certain type of a capacitively coupled plasma etching apparatus, in a case where a plasma density in a processing space and, furthermore, an etching rate in a wafer plane tend to become relatively higher in the central portion of the wafer than in the peripheral portion thereof, a configuration is employed in which a tapered inclined portion or stepwise protrusion is formed in a peripheral portion of an upper electrode (a portion just above the wafer edge or a portion radially outward from the wafer edge) such that an inter-electrode gap between the upper electrode and a lower electrode becomes narrower in the peripheral portion of the wafer than in the central portion thereof. However, due to the gradient of the electrode surface, inclination is generated in the radial direction even in the ion sheath formed on the surface of the electrodes. Furthermore, the thickness of the ion sheath is also influenced by the unevenly existing inter-electrode gap. For example, when the thickness of the ion sheath formed above the central portion of the wafer is different from the thickness of the ion sheath formed above the peripheral portion of the wafer, a ratio at which ions are incident diagonally is increased in a certain region of the semiconductor wafer (e.g., the central region). Thus, tilting is easily generated.

Although the conventional capacitively coupled plasma etching apparatus provides the magnetic field forming mechanism as disclosed in Patent Document 1, 2, or 3, such tilting may not be effectively suppressed.

The present disclosure solves the problems of the conventional techniques as described above, and provides a plasma processing apparatus and a plasma processing method capable of enhancing the production efficiency and reducing the production cost, as compared with the conventional techniques.

Means to Solve the Problems

The present disclosure provides a plasma processing apparatus for performing a processing on a processing target substrate by applying plasma of a processing gas to the processing target substrate. The plasma processing apparatus includes a processing container configured to removably accommodate the processing target substrate; a lower electrode provided in the processing container to place the processing target substrate thereon; an upper electrode provided in the processing container to face the lower electrode; a high frequency power source configured to apply a high frequency power between the upper electrode and the lower electrode; and an electromagnet having one or more annular coils around a central axis that passes through a center of the lower electrode vertically, in an upper portion or at an upper side of the processing container.

In the plasma processing apparatus having the above configuration, when a coil in the electromagnet is excited (energized), a magnetic effect in which the plasma density is increased in a region offset radially inward from the energized coil in the processing container, and the plasma density is decreased in a region just below the coil, is exerted. Therefore, for example, in a case where a tilting phenomenon is generated in some or all of the region on the processing target substrate due to a constant factor, when one of the coils in the magnet is selectively excited (energized), the magnetic effect as described above is exerted around the coil to flatten the interface between the ion sheath and the bulk plasma on the region of the processing target substrate. Thus, ions may be incident vertically on the surface of the substrate, thereby suppressing tilting.

The present disclosure provides a plasma processing method for performing a processing on a processing target substrate by applying plasma of a processing gas to the processing target substrate using a plasma processing apparatus including a processing container configured to removably accommodate the processing target substrate; a lower electrode provided in the processing container to place the processing target substrate thereon; an upper electrode provided in the processing container to face the lower electrode; a high frequency power source configured to apply a high frequency power between the upper electrode and the lower electrode; and an electromagnet having one or more annular coils around a central axis that passes through a center of the lower electrode vertically, in an upper portion or at an upper side of the processing container. The plasma processing method includes controlling a gradient of an interface between an ion sheath and bulk plasma formed on the processing target substrate and on the focus ring by selectively energizing one of the annular coils in the electromagnet to generate a magnetic field therearound.

Effect of the Invention

According to the plasma processing apparatus or the plasma processing method of the present disclosure, a so-called tilting phenomenon may be effectively suppressed, and the enhancement of the production efficiency and the reduction of the production cost may be facilitated by the configuration and the action as described above.

DETAILED DESCRIPTION TO EXECUTE THE INVENTION

Figure 1:
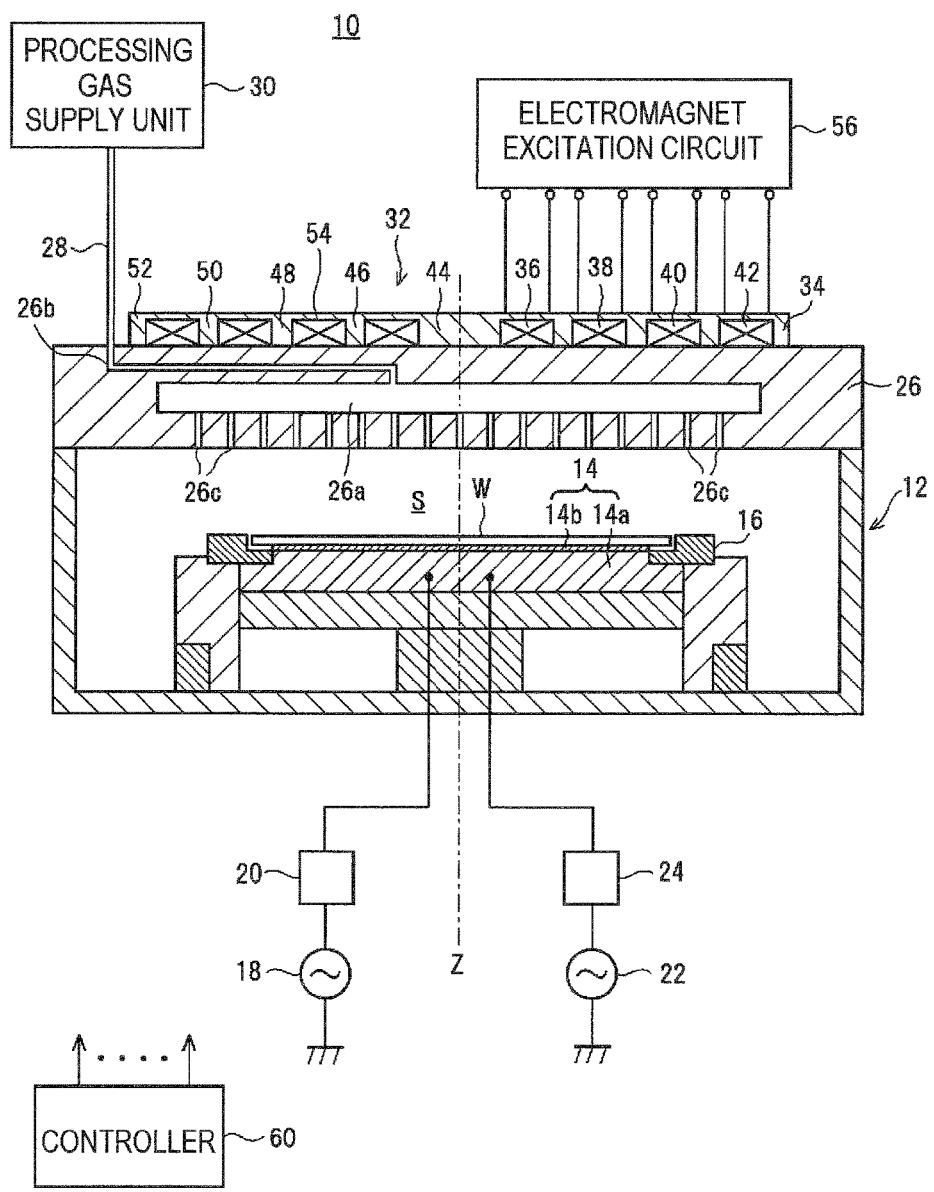
FIG. 1 is a schematic view illustrating an outlined configuration of a plasma processing apparatus according to an exemplary embodiment of the present disclosure.

Hereinafter, exemplary embodiments of the present disclosure will be described with reference to the accompanying drawings. FIG. 1 illustrates a schematic sectional configuration of a plasma processing apparatus according to an exemplary embodiment. The plasma processing apparatus 10 is configured as a capacitively coupled plasma etching apparatus, and includes a hermetically closable cylindrical chamber (processing container) 12 that removably accommodates, for example, a 300 mm diameter semiconductor wafer W.

A disc-shaped placing table 14 is provided in a central lower portion within the chamber 12 to place the semiconductor wafer W thereon as a processing target. The placing table 14 includes a base 14a and an electrostatic chuck 14b. The base 14a is made of a conductive member such as, for example, aluminum.

An annular focus ring 16 is provided in a peripheral edge region of the top surface of the base 14a to surround the semiconductor wafer W. In addition, the disc-shaped electrostatic chuck 14b is provided in a central region of the top surface of the base 14a. The electrostatic chuck 14b is provided with an insulating film that encapsulates an electrode film. The electrode film is supplied with a DC voltage from a DC power source (not illustrated), and thus, the semiconductor wafer W is attracted and held by the electrostatic force generated from the electrostatic chuck 14b.

In a state where the semiconductor wafer W is placed on the electrostatic chuck 14b, a central axis Z passing through the center of the semiconductor wafer W in the vertical direction substantially coincides with a central axis of the base 14a and the electrostatic chuck 14b.

The base 14a constitutes a lower electrode. The base 14a is electrically connected, via a first matcher 20, with a first high frequency power source 18 that generates a high frequency power for plasma generation. The first high frequency power source 18 generates a high frequency power having a frequency of, for example, 100 MHz. The first matcher 20 includes a matching circuit to match the output impedance of the high frequency power source 18 and the load impedance of the base (lower electrode) 14a side.

In the exemplary embodiment, the first high frequency power source 18 is configured to output a high frequency power in a pulse form at a desired frequency (e.g., 50 kHz) and a desired duty ratio (e.g., 20%) suitable for a high frequency discharge of the processing gas. Thus, since a plasma generating period and a plasma non-generating period are provided within one cycle of the pulse frequency, charge accumulation at a specific site on the semiconductor wafer W may be reduced. That is, even though charge accumulation occurs at a specific site where the electron density on the semiconductor wafer W is high due to non-uniformity of the electron density in the plasma during the plasma generating period, the charge accumulation may be eliminated by dispersing the charge perimetrically during the plasma non-generating period. Therefore, for example, the breakdown of the insulating film may be suppressed from occurring on the surface of the wafer.

In addition, the base 14a is electrically connected, via a second matcher 24, with a second high frequency power source 22 that generates a high frequency power for ion attraction. The second high frequency power source 22 generates a high frequency power having a frequency suitable for controlling energy of ions to be incident on the semiconductor wafer W on the placing table 14 (e.g., 3.2 MHz). The second matcher 24 includes a matching circuit to match the output impedance of the high frequency power source 22 and the load impedance of the lower electrode side.

An upper electrode 26 is provided above the placing table (lower electrode) 14 to face the placing table 14 through the processing space S. The upper electrode 26 constitutes a top plate of the chamber 12, and partitions the processing space S from the upper side. The upper electrode 26 is disposed such that the central axis thereof substantially coincides with the central axis Z of the placing table 14.

The upper electrode 26 also functions as a shower head configured to introduce a predetermined processing gas into the processing space S in a shower form. In the exemplary embodiment, the upper electrode 26 is formed with a buffer chamber 26a, internal gas line 26b, and a plurality of gas holes 26c. The buffer chamber 26a is connected with a processing gas supply unit 30 via the internal gas line 26b and an external gas line 28. The gas holes 26c of the upper electrode 26 extend downward from the buffer chamber 26a, and are opened to the processing space S. Meanwhile, the bottom portion of the chamber 12 is connected to an exhaust mechanism such as, for example, a turbo molecular pump (TMP) or a dry pump (DP) (not illustrated) so that the processing space S within the chamber 12 may be maintained in a reduced atmosphere of a predetermined pressure.

An electromagnet 32 is disposed on the upper electrode 26. The electromagnet 32 includes a yoke member 34 and coils 36, 38, 40, 42. The yoke member 34 has a structure in which a columnar portion 44, a plurality of cylindrical portions 46, 48, 50, 52, and a base portion or back plate portion 54 are formed integrally, and is made of a soft magnetic material. The back plate portion 54 extends horizontally to have a substantial disc shape, and the central axis thereof is provided along the central axis Z. The columnar portion 44 and the cylindrical portions 46, 48, 50, 52 are formed concentrically, and extend so as to protrude downward from the lower surface of the back plate portion 54. The columnar portion 44 has a substantially columnar shape, and the central axis thereof is provided to follow the central axis Z. The radius L1 of the columnar portion 44 (see FIG. 2) is, for example, 30 mm.

Figure 2:
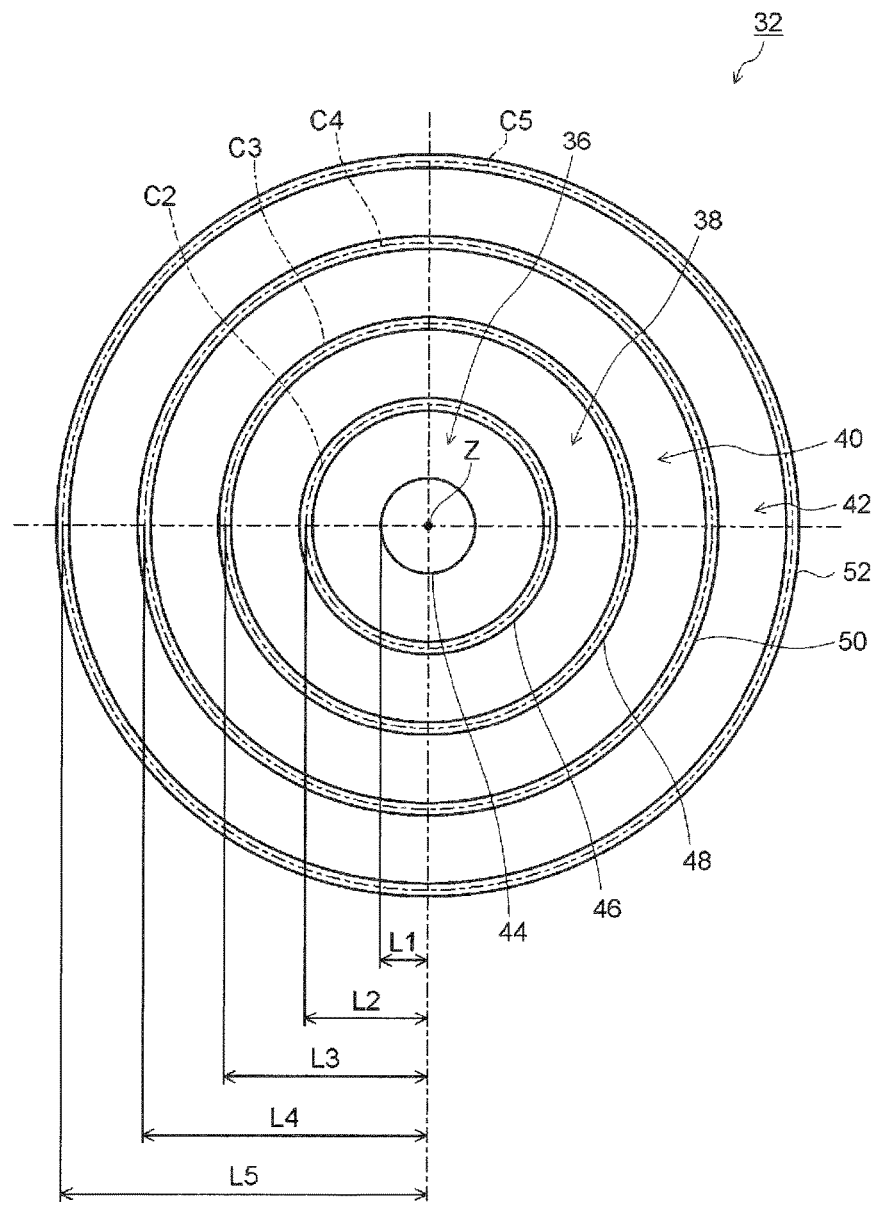
FIG. 2 is a schematic view illustrating an outlined configuration of a main part of the plasma etching apparatus of FIG. 1.

Each of the cylindrical portions 46, 48, 50, 52 has a cylindrical shape extending in parallel with the central axis Z. As illustrated in FIG. 2, the cylindrical portions 46, 48, 50, 52 are provided along a plurality of concentric circles C2, C3, C4, C5, respectively, around the central axis Z. More specifically, the cylindrical portion 46 is disposed along the concentric circle C2 having a radius L2 larger than the radius L1. The cylindrical portion 48 is disposed along the concentric circle C3 having a radius L3 larger than the radius L2. The cylindrical portion 50 is disposed along the concentric circle C4 having a radius L4 larger than the radius L3. The cylindrical portion 52 is disposed along the concentric circle C5 having a radius L5 larger than the radius L4.

In an example, the radii L2, L3, L4, L5 are 76 mm, 127 mm, 178 mm, and 229 mm, respectively. Further, the central positions of the coils 36, 38, 40, 42 are approximately 50 mm, 100 mm, 150 mm, and 200 mm, respectively, from the central axis Z.

In the yoke member 34, a bottom-opened annular groove is formed between the columnar portion 44 and the innermost circumferential cylindrical portion 46. As illustrated in FIG. 1, the coil 36, which is wound along the outer circumferential surface of the columnar portion 44, is accommodated in the groove. Therefore, the bottom surface of the coil 36 is exposed, and the inner surface, the outer surface, and the top surface of the coil 36 are covered by the columnar portion 44, the cylindrical portion 46, and the back plate portion 54 of the yoke member 34.

A bottom-opened annular groove is also formed between the cylindrical portion 46 and a cylindrical portion 48 adjacent to the outside the cylindrical portion 46. The coil 38, which is wound along the outer circumferential surface of the cylindrical portion 46, is accommodated in the groove. Therefore, the bottom surface of the coil 38 is exposed, and the inner surface, the outer surface, and the top surface of the coil 38 are covered by the cylindrical portions 46, 48 and the back plate portion 54 of the yoke member 34.

A bottom-opened annular groove is also formed between the cylindrical portion 48 and a cylindrical portion 50 adjacent to the outside of the cylindrical portion, and the coil 40, which is wound along the outer circumferential surface of the cylindrical portion 48, is accommodated in the groove. Therefore, the bottom surface of the coil 40 is exposed, and the inner surface, the outer surface, and the top surface of the coil 40 are covered by the cylindrical portions 48, 50 and the back plate portion 54 of the yoke member 34.

A bottom-opened annular groove is also formed between the cylindrical portion 50 and a (outermost circumferential) cylindrical portion 52 adjacent to the outside of the cylindrical portion 50, and the coil 42, which is wound along the outer circumferential surface of the cylindrical portion 50, is accommodated in the groove. Therefore, the bottom surface of the coil 42 is exposed, and the inner surface, the outer surface, and the top surface of the coil 42 are covered by the cylindrical portions 50, 52 and the back plate portion 54 of the yoke member 34.

As described above, in the electromagnet 32, the radii L4, L5 are larger than the radius (150 mm) of the semiconductor wafer W. Thus, as illustrated in FIG. 1, the outermost circumferential coil 42 is positioned radially outward from the outer peripheral edge of the semiconductor wafer W, and disposed such that at least a part thereof is positioned above the focus ring 16. Further, the innermost circumferential coil 36 is disposed to be positioned above the central portion of the semiconductor wafer W. In addition, the second coil 38 as viewed from the central axis Z is disposed to extend across the intermediate portion and the peripheral portion of the semiconductor wafer W in the radial direction. And, the third coil 40 is disposed to extend across the peripheral portion and the outside of the semiconductor wafer W in the radial direction when viewed from the central axis Z.

Both ends of each of the coils 36, 38, 40, 42 are electrically connected to an electromagnet excitation circuit 56. The electromagnet excitation circuit 56 is able not only to selectively energize any one of the coils 36, 38, 40, 42 with an arbitrary excitation current under a control of a controller 60 (to be described later), but also to energize a plurality of coils in any combination with a common or individual arbitrary excitation current at the same time.

Figure 3:
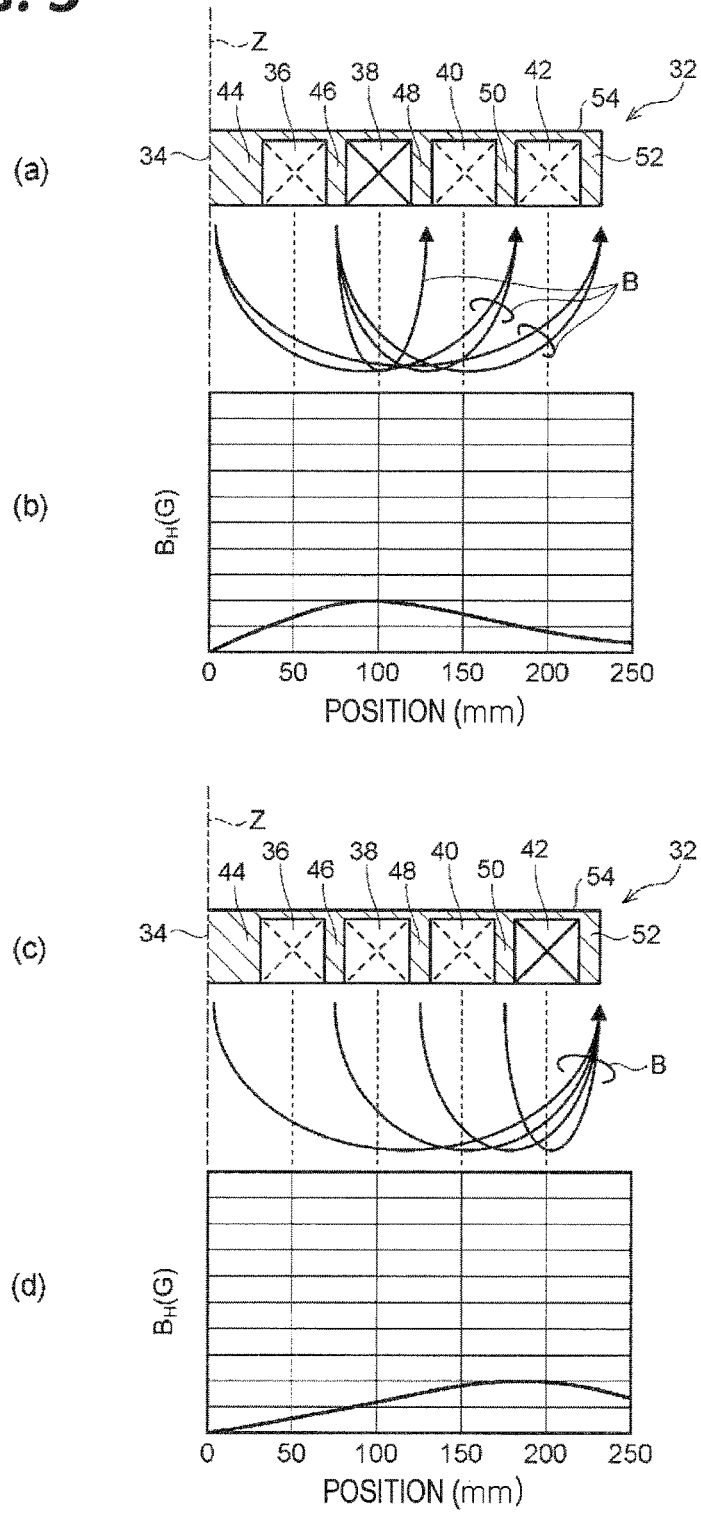
FIG. 3 is a view illustrating an example of a magnetic field formed by an electromagnet.

According to the electromagnet 32 as configured above, a magnetic field B having a horizontal magnetic field component $B_H$ along the diametric direction with respect to the central axis Z may be formed in the processing space S by supplying an electric current to one or more coils among the coils 36, 38, 40, 42. FIG. 3 illustrates an example of a magnetic field formed by the electromagnet 32.

FIG. 3(*a*) illustrates a cross-section of the electromagnet 32 in a half-plane with respect to the central axis Z and a magnetic field B when an electric current is supplied to the second coil 38 as viewed from the central axis Z. FIG. 3(*b*) illustrates an intensity distribution of the horizontal magnetic component $B_H$ when an electric current is supplied to the coil 38.

FIG. 3(*c*) illustrates a cross-section of the electromagnet 32 in a half-plane with respect to the central axis Z and a magnetic field B when an electric current is supplied to the outermost circumferential coil 54. FIG. 3(*d*) illustrates an intensity distribution of the horizontal magnetic component $B_H$ when an electric current is supplied to the coil 54. In the graphs illustrated in FIGS. 3(*b*) and 3(*d*), the horizontal axis represents a position in the diametric direction when the position of the central axis Z is set to 0 mm, and the vertical axis represents an intensity (magnetic flux density) of the horizontal magnetic field component $B_H$.

When an electric current is supplied to the coil 38 of the electromagnet 32, the magnetic field B as illustrated in FIG. 3(*a*) is formed. That is, the magnetic field B having a magnetic force line loop coming out from the lower ends of the columnar portion 44 and the cylindrical portion 46 and going into the lower ends of the cylindrical portions 48, 50, 52 via the processing space S therebelow, is formed. The magnetic force line loop of the magnetic field B returns to the columnar portion 44 and the cylindrical portion 46 around the back plate portion 54 from the lower ends of the cylindrical portions 48, 50, 52, in the yoke member 34.

The intensity distribution in the diametric direction of the horizontal magnetic field component $B_H$ of the magnetic field B becomes an intensity distribution having a peak below the central portion of a coil conductor of the coil 38, as illustrated in FIG. 3(*b*). In an example, the center of the coil conductor of the coil 38 is positioned about 100 mm apart from the axis Z. When a 300 mm diameter wafer W is processed, the position thereof is an intermediate position of the center and the edge of the wafer W in the diametric direction.

Further, when an electric current is supplied to the coil 42 of the electromagnet 32, a magnetic field B as illustrated in FIG. 3(*c*) is formed. That is, the magnetic field B is foamed which has a magnetic force line loop coming out from the lower ends of the columnar portion 44 and the cylindrical portions 46, 48, 50 and going into the lower ends of the cylindrical portion 52 via the processing space S therebelow. The magnetic force line loop of the magnetic field B returns to the columnar portion 44 and the cylindrical portions 46, 48, 50 around the back plate portion 54 from the lower end of the cylindrical portion 52, in the yoke member 34.

The intensity distribution in the diametric direction of the horizontal magnetic field component $B_H$ of the magnetic field B becomes an intensity distribution having a peak below the central portion of a coil conductor of the coil 42, as illustrated in FIG. 3(*d*). In an example, the center of the coil 42 is positioned about 200 mm apart from the axis Z. When a 300 mm diameter (150 mm radius) wafer W is processed, the center of the coil 42 is positioned outside the edge of the wafer W in the diametric direction, that is, at the position of the focus ring 16.

In the plasma etching apparatus 10, a controller 60 includes one or more microcomputers, and controls individual operations of respective parts in the apparatus, particularly, the high frequency power sources 18, 22, the matchers 20, 24, the processing gas supply unit 30, the electromagnet excitation circuit 56, and the exhaust device, and an operation (sequence) of the entire apparatus, according to software (program) and recipe information stored in an external memory or an internal memory.

Further, the controller 60 is also connected to an operation panel for a man-machine interface including an input device (e.g., a keyboard) and a display device (e.g., a liquid crystal display) (not illustrated) and an external storage device for storing or accumulating various program or various data (e.g., recipes and set values) (not illustrated). In the exemplary embodiment, the controller 60 is illustrated as a single control unit, but a plurality of control units may share the function of the controller 60 in parallel, or hierarchically.

In the plasma etching apparatus 10, when an etching processing is performed on the semiconductor wafer W on the placing table 14, a processing gas, that is, an etching gas is supplied from the processing gas supply unit 30 to the processing space S within the chamber 12 through the shower head (upper electrode) 26, and a high frequency power is imparted from the first high frequency power source 18 to the placing table (lower electrode) 14 to generate a high frequency electric field between the upper electrode 26 and the placing table 14. Therefore, plasma is generated in the processing space S by the high frequency discharge of the processing gas. Then, an etching processing of a predetermined pattern defined by an etching mask may be performed on a processing target film of the surface of the semiconductor wafer W by radicals and ions generated when molecules or atoms constituting the processing gas are dissociated or ionized. Further, the energy of the ions incident on the semiconductor wafer W may be controlled by adjusting a power of a high frequency bias imparted from the second high frequency power source 22 to the placing table 14 serving as the lower electrode.

However, when an etching processing is performed on the semiconductor wafer W with a high aspect ratio, particularly, when a contact hole of a high aspect ratio is formed, a phenomenon that the contact hole is inclined (tilting) may be generated in some in-plane regions of the wafer.

Figure 4:
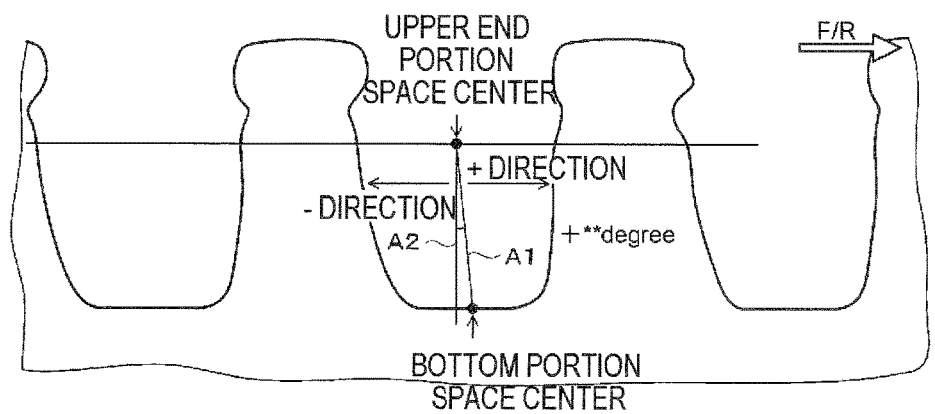
FIG. 4 is a view for explaining a generation state of tilting.

FIG. 4 schematically illustrates an example of an enlarged view of the cross-section along the diametric direction in a case where a hole or line shape is formed in the semiconductor wafer W by plasma etching. Further, in FIG. 4, the left side is the central direction of the semiconductor wafer W, and the left side is a direction of the focus ring (the peripheral portion of the semiconductor wafer W).

As illustrated in FIG. 4, in a case where a hole or trench is formed by plasma etching, when ions are incident diagonally on the semiconductor wafer W, and thus, inclination is generated in the semiconductor wafer W in the etched state, the central position of the space in the upper end portion (upper end portion space center) of the formed hole or trench and the central position of the space in the bottom portion (bottom portion space center) of the space thereof are displaced, and a line A1 connecting these positions is inclined with respect to a perpendicular line A2 drawn from the upper end portion space center.

Such a state corresponds to a state where tilting is generated, and the tilting generation state may be quantitatively evaluated by measuring an angle formed between the line A1 and the perpendicular line A2 (hereinafter, referred to as a "tilting angle"). Such tilting is a major problem in a progress in miniaturization or a progress in multi-layering of, for example, a three-dimensional NAND.

Here, descriptions will be made on an action in a case where one of the coils 36, 38, 40, 42 of the electromagnet 32 is selectively energized in an application of the plasma etching for forming a hole with a high aspect ratio using the plasma etching apparatus of the exemplary embodiment, substantially without generating tilting in the insulating film on the surface of the semiconductor wafer W. The main etching conditions in the test are as follows.

Pressure in chamber: 5.32 Pa (40 mTorr)
Processing gas: $C_4F_8/C_4F_6/Ar/O_2=35/10/400/20$ sccm
First high frequency waves: frequency: 100 MHz, power: 300 W, pulse period: 50 kHz, duty ratio: 20%
Second high frequency waves: frequency: 3.2 MHz, power: 10,000 W
Processing time: 60 seconds FIG. 5 illustrates measurement results of an etching rate distribution characteristic and a tilt angle distribution characteristic on the wafer obtained when the innermost circumferential coil 36 is energized to form a magnetic field of 15 G.

Figure 5:
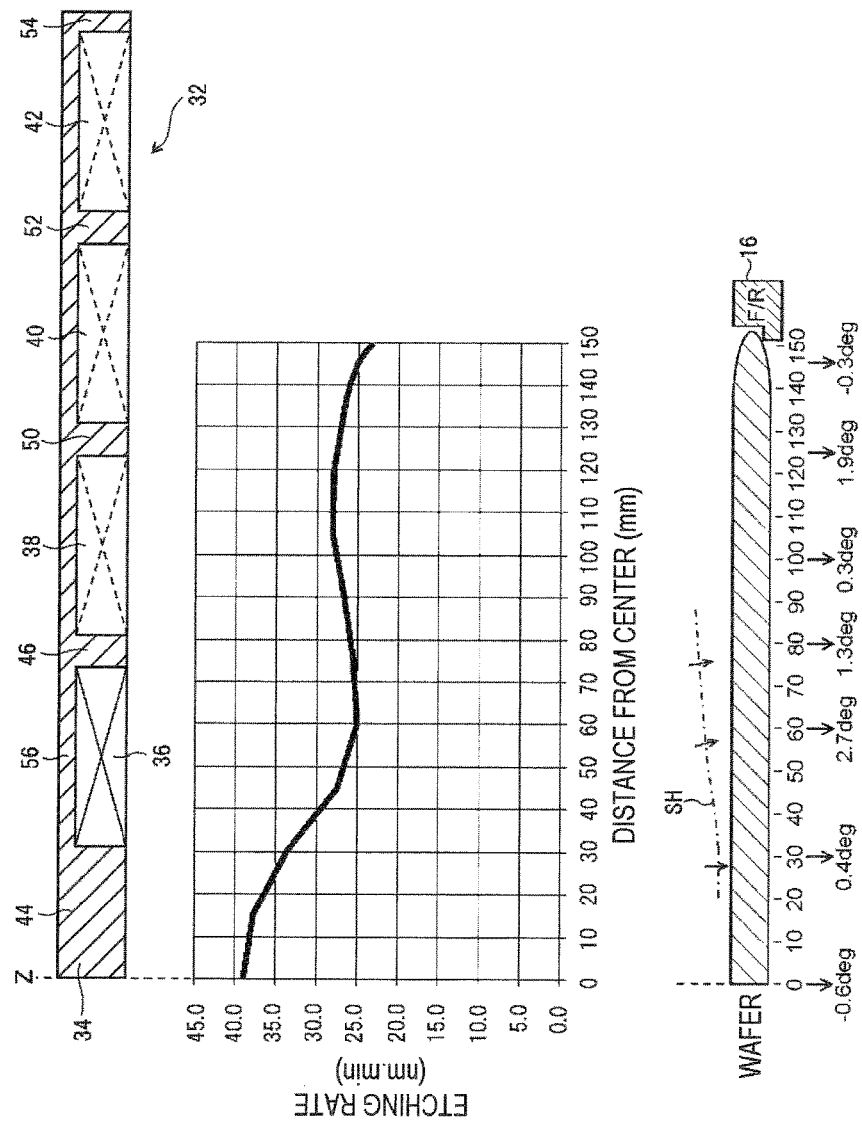
FIG. 5 is a graph illustrating measurement results of an etching rate distribution characteristic on the wafer and a tilt angle distribution characteristic on the wafer obtained when a coil 36 is energized.

As illustrated in FIG. 5, the etching rate distribution characteristic tends to increase in a region of the central portion offset radially inward from the coil 36 (about 0 to 20 mm), and decrease in a region just below the coil 36 (about 30 to 70 mm), ranging from the wafer center side to the wafer edge side.

From the etching rate distribution characteristic, it can be seen that, when the coil 36 is excited (energized), the plasma density in the processing space S is relatively high in the region of the central portion (about 0 to 20 mm), and is relatively low in the region just below the coil 36 (about 30 to 70 mm). Generally, when a magnetic field exists in a site in the processing space S, electrons receive Lorenz force and drift in the vicinity of the site so that the electrons repeat ionization collision with molecules or atoms of the processing gas many times. Thus, the plasma density is increased. As a result of verification, it has been found that the magnetic field affecting the plasma density acts positively in the region of the central portion offset radially inward from the coin 36 (about 0 to 20 mm), and acts negatively in the region just below the coil 36 (about 30 to 70 mm).

Further, as illustrated, the tilting angle distribution characteristic is −0.6, 0.4, 2.7, 1.3, 0.3, 1.9, and −0.3 degrees (deg.) in positions of 0 mm, 30 mm, 60 mm, 80 mm, 100 mm, 125 mm, and 145 mm from the center of the wafer W, respectively. That is, a site where the tilting angle has a negative value (−0.6 deg.) exists in the region radially inward from the coil 36, and the tilting angle has a positive value in the region ranging from the site just below the coil 36 to the vicinity of the wafer edge position (about 30 to 125 mm). Further, the tilting angle has a negative value (−0.3 deg.) at the wafer edge position (150 mm). However, since the wafer edge position is too far away from the coil 36 to be affected by the magnetic field formed by the coil 36, it is considered that there is another factor that the tilting angle becomes a negative value (−0.3 deg.).

From the tilting angle distribution characteristic, the profile of the ion sheath formed on the wafer W or the focus ring 16 may be estimated or identified. That is, since ions are remarkably heavier than electrons and the movement speed of the ions is lower than that of the electrons, the Lorenz force or acceleration that the ions receives from the magnetic field is negligibly small in the processing space S as well as in the ion sheath. That is, it may be said that the movement speed (vector) at which the ions are incident on the surface of the wafer W is determined by the electric field (vector) in the ion sheath. Further, the direction of the electric field (vector) in the ion sheath depends on the flatness or inclination of the ion sheath. Assuming that the surface of the wafer W is flat, the direction depends on the flatness or inclination of the interface between the ion sheath and the bulk plasma.

Accordingly, as described above, from the fact that the tilting angle has a positive value (2.7 deg.) at the position just below the coil 36 (60 mm), it may be supposed that the interface between the ion sheath and the bulk plasma on the wafer W is inclined upward in the radial direction in the vicinity thereof as indicated by a dotted line SH in FIG. 5, in other words, the plasma density is inclined downward. This is well consistent with the etching rate distribution characteristic of FIG. 5 as described above.

Also in the other regions, at a position where the tilting angle has a positive value, it may be supposed that the interface between the ion sheath and the bulk plasma on the wafer W in the vicinity of the position is inclined upward in the radial direction, that is, the plasma density is inclined downward. Further, at a position where the tilting angle has a negative value, it may be supposed that the interface between the ion sheath and the bulk plasma on the wafer W in the vicinity of the position is inclined downward in the radial direction, that is, the plasma density is inclined upward.

Figure 6:
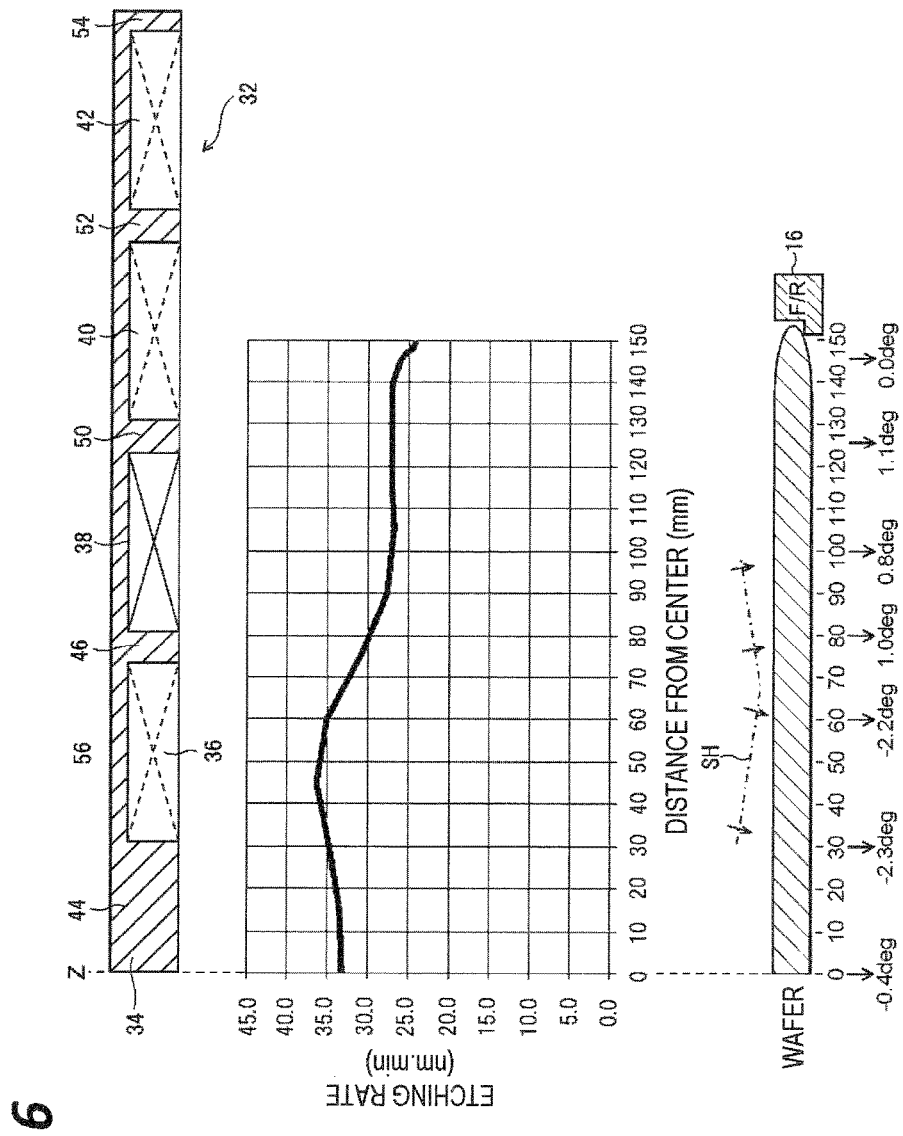
FIG. 6 is a graph illustrating measurement results of an etching rate distribution characteristic on the wafer and a tilt angle distribution characteristic on the wafer obtained when a coil 38 is energized.

FIG. 6 illustrates measurement results of an etching rate distribution characteristic and a tilt angle distribution characteristic on the wafer obtained when the coil 38 is energized to form a magnetic field of 15 G.

As illustrated in FIG. 6, the etching rate distribution characteristic tends to increase in a region offset radially inward from the coil 38 (about 30 to 60 mm), and decrease in a region just below the coil 38 (about 80 to 110 mm), ranging from the wafer center side to the wafer edge side.

Therefore, it can be seen that, when the coil 38 is excited (energized), the magnetic field affecting the plasma density in the processing space S acts positively in the region of the central portion offset radially inward from the coin 38 (about 30 to 60 mm), and acts negatively in the region just below the coil 38 (about 80 to 110 mm).

Further, as illustrated, the tilting angle distribution characteristic is −0.4, −2.3, −2.2, 1.0, 0.8, 1.1, and 0.0 degrees (deg.) in positions of 0 mm, 30 mm, 60 mm, 80 mm, 100 mm, 125 mm, and 145 mm from the center of the wafer W, respectively. That is, sites (30 mm, 60 mm) where the tilting angle has a negative value (−2.3 deg., −2.2 deg.) exist in the region radially inward from the coil 38, and the tilting angle has a positive value or zero (0) in the region just below the coil 38 and the whole regions radially outward therefrom (about 100 to 150 mm).

Thus, from the fact that the tilting angle has a positive value (1.0 deg.) at the position just below the coil 38 (100 mm), it may be supposed that the interface between the ion sheath and the bulk plasma on the wafer W is inclined upward in the radial direction in the vicinity thereof as indicated by a dotted line SH in FIG. 6, that is, the plasma density is inclined downward. Further, since the tilting angle has negative values (−2.3 deg., −2.2 deg.) at the positions offset radially inward from the coil 38 (30 mm, 60 mm), it may be supposed that the interface between the ion sheath and the bulk plasma on the wafer W is inclined downward in the radial direction in the vicinity thereof as indicated by the dotted line SH, that is, the plasma density is inclined upward. Therefore, it may be supposed that the plasma density is maximized around a region where the tilting angle is reversed from a negative value to a positive value (around 70 mm).

Figure 7:
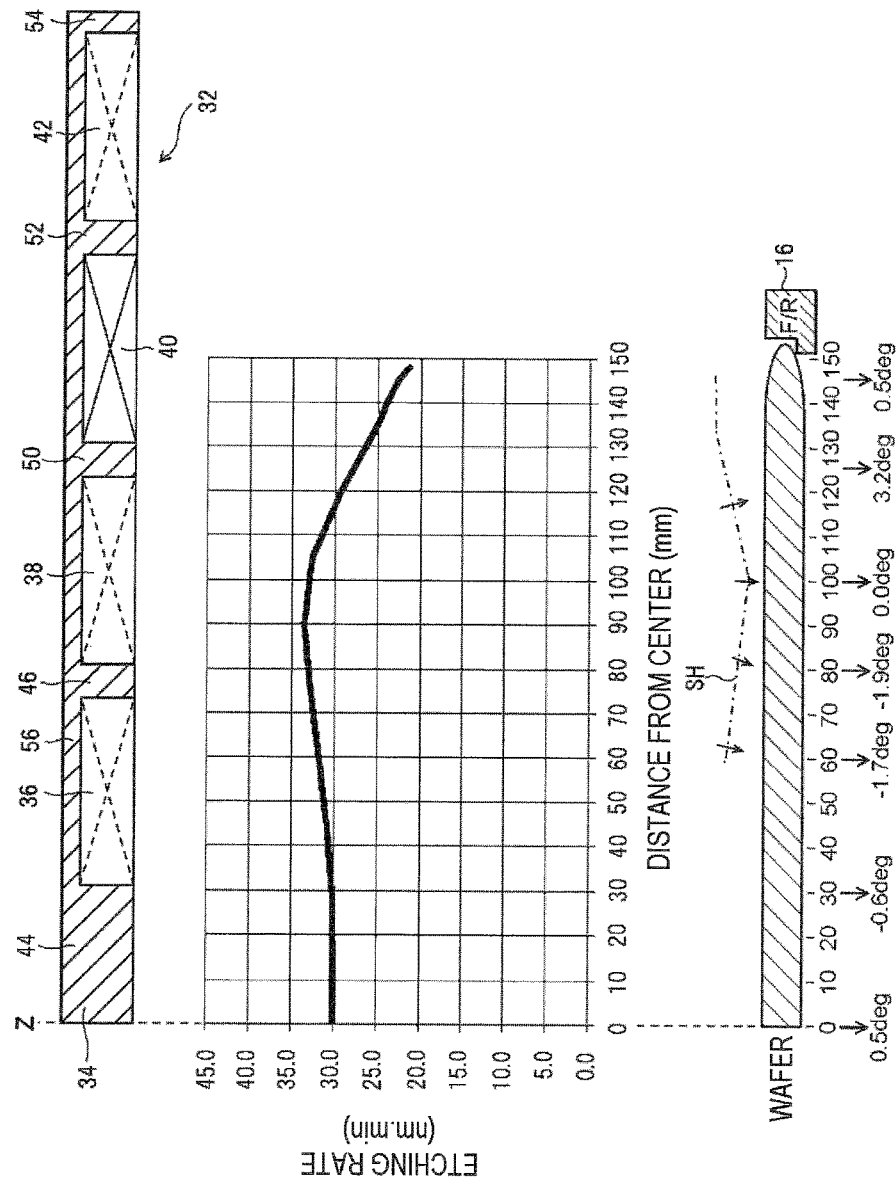
FIG. 7 is a graph illustrating measurement results of an etching rate distribution characteristic on the wafer and a tilt angle distribution characteristic on the wafer obtained when a coil 40 is energized.

FIG. 7 illustrates measurement results of an etching rate distribution characteristic and a tilt angle distribution characteristic on the wafer obtained when the coil 40 is energized to form a magnetic field of 15 G.

As illustrated in FIG. 7, the etching rate distribution characteristic tends to increase in a region offset radially inward from the coil 40 (about 80 to 110 mm), and decrease in a region just below the coil 40 (about 130 mm or more), ranging from the wafer center side to the wafer edge side.

Therefore, it can be seen that, when the coil 40 is excited (energized), the magnetic field affecting the plasma density in the processing space S acts positively in the region of the intermediate portion of the wafer offset radially inward from the coin 40 (about 80 to 110 mm), and acts negatively in the region just below the coil 40 (about 130 mm or more).

Further, as illustrated, the tilting angle is 0.5, −0.6, −1.7, −1.9, 0.0, 3.2, and 0.5 degrees (deg.) in positions of 0 mm, 30 mm, 60 mm, 80 mm, 100 mm, 125 mm, and 145 mm from the center of the wafer W, respectively. That is, regions (30 mm, 60 mm, 80 mm) where the tilting angle has negative values (−0.6 deg., −1.7 deg., −1.9 deg.) exist at a side radially inward from the coil 40, and the tilting angle has a positive value or zero (0) in the region just below the coil 40 and the whole regions radially outward therefrom (about 125 mm to 150 mm).

Thus, from the fact that the tilting angle has positive values (3.2 deg., 0.5 deg.) at the positions just below the coil 40 (125 mm, 145 mm), it may be supposed that the interface between the ion sheath and the bulk plasma on the wafer W is inclined upward in the radial direction in the vicinity thereof as indicated by a dotted line SH in FIG. 7, that is, the plasma density is inclined downward. Further, from the fact that the tilting angle has negative values (−1.7 deg., −1.9 deg.) at the positions above the intermediate portion of the wafer offset radially inward from the coil 40 (60 mm, 80 mm), it may be supposed that the interface between the ion sheath and the bulk plasma on the wafer W is inclined downward in the radial direction in the vicinity thereof as indicated by the dotted line SH, that is, the plasma density is inclined upward. Therefore, it may be supposed that the plasma density is maximized around a region where the tilting angle is reversed from a negative value to a positive value (around 100 mm).

Figure 8:
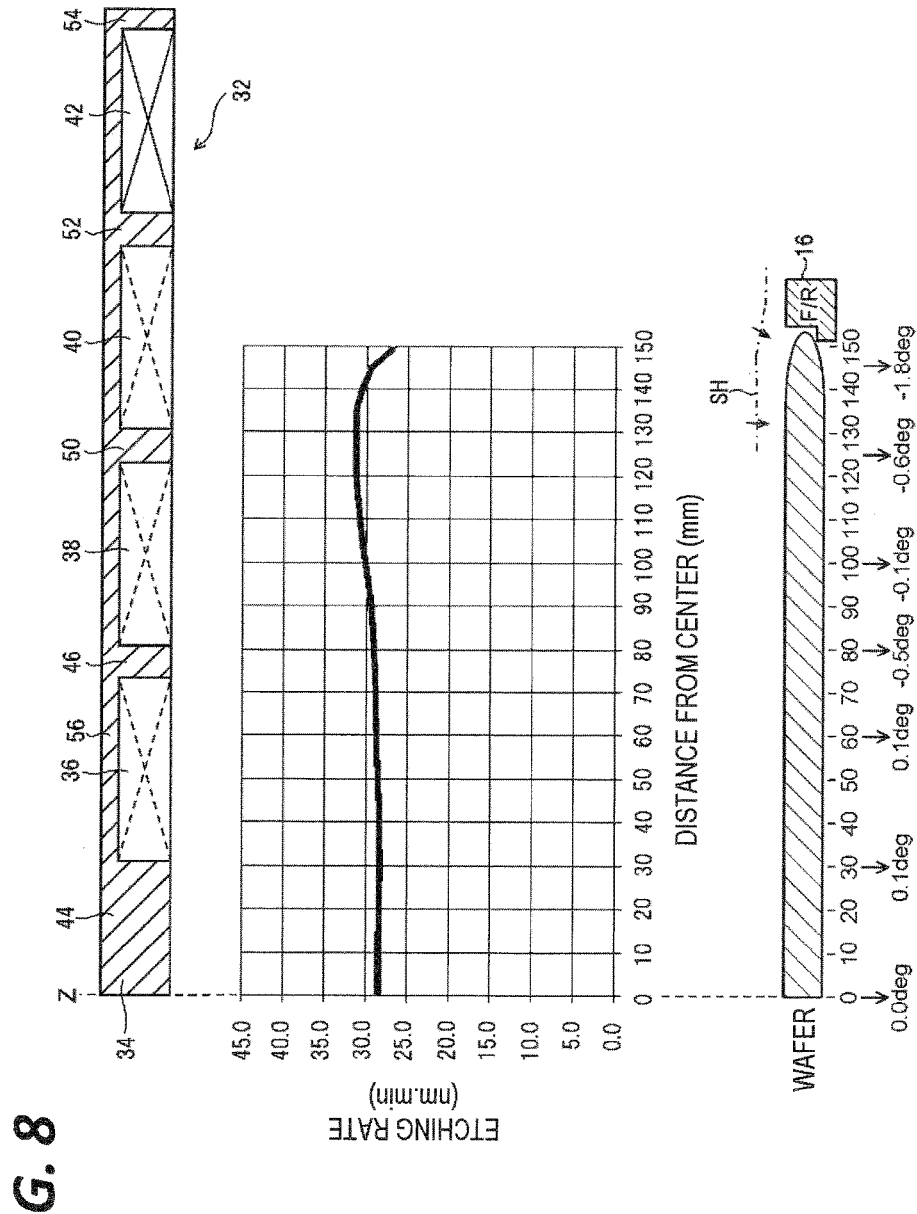
FIG. 8 is a graph illustrating measurement results of an etching rate distribution characteristic on the wafer and a tilt angle distribution characteristic on the wafer obtained when a coil 42 is energized.

FIG. 8 illustrates a measurement result of an etching rate distribution characteristic and a measurement result of a tilt angle distribution characteristic on the wafer obtained when the coil 42 is energized to form a magnetic field of 15 G.

As illustrated in FIG. 8, the etching rate distribution characteristic tends to increase around a region radially inward from the coil 42 (about 110 to 140 mm).

Therefore, it can be seen that, when the coil 42 is excited (energized), the magnetic field affecting the plasma density in the processing space S acts positively in the region above the peripheral portion of the wafer offset radially inward from the coin 42 (about 110 to 140 mm).

Further, as illustrated, the tilting angle distribution characteristic is 0.0, 0.1, 0.1, −0.5, −0.1, −0.6, and −1.8 degrees (deg.) in positions of 0 mm, 30 mm, 60 mm, 80 mm, 100 mm, 125 mm, and 145 mm from the center of the wafer W, respectively. That is, regions where the tilting angle has negative values (−0.5 deg., −0.1 deg., −0.6 deg., −1.8 deg.) (60 mm, 80 mm, 125 mm, 145 mm) exist at a side radially inward from the coil 42.

Further, since the tilting angle has a negative value (−1.8 deg.) at the position in the peripheral portion of the wafer offset radially inward from the coil 42 (140 mm), it may be supposed that the interface between the ion sheath and the bulk plasma on the wafer W is inclined upward in the radial direction in the vicinity thereof as indicated by the dotted line SH, that is, the plasma density is inclined downward.

As described above, it can be seen that, when one of the coils 36, 38, 40, 42 of the electromagnet 32 is selectively energized, the etching rate, that is, the plasma density becomes relatively higher in the region slightly offset radially inward from the energized coil, that is, the coil forming a magnetic field in the processing space S, on the semiconductor wafer W, so that a negative tilting angle is easily generated, and the etching rate, that is, the plasma density becomes relatively lower in the region just below a region overlapping with the coil in the vertical direction, so that a positive tilting angle is easily generated.

Figure 9:
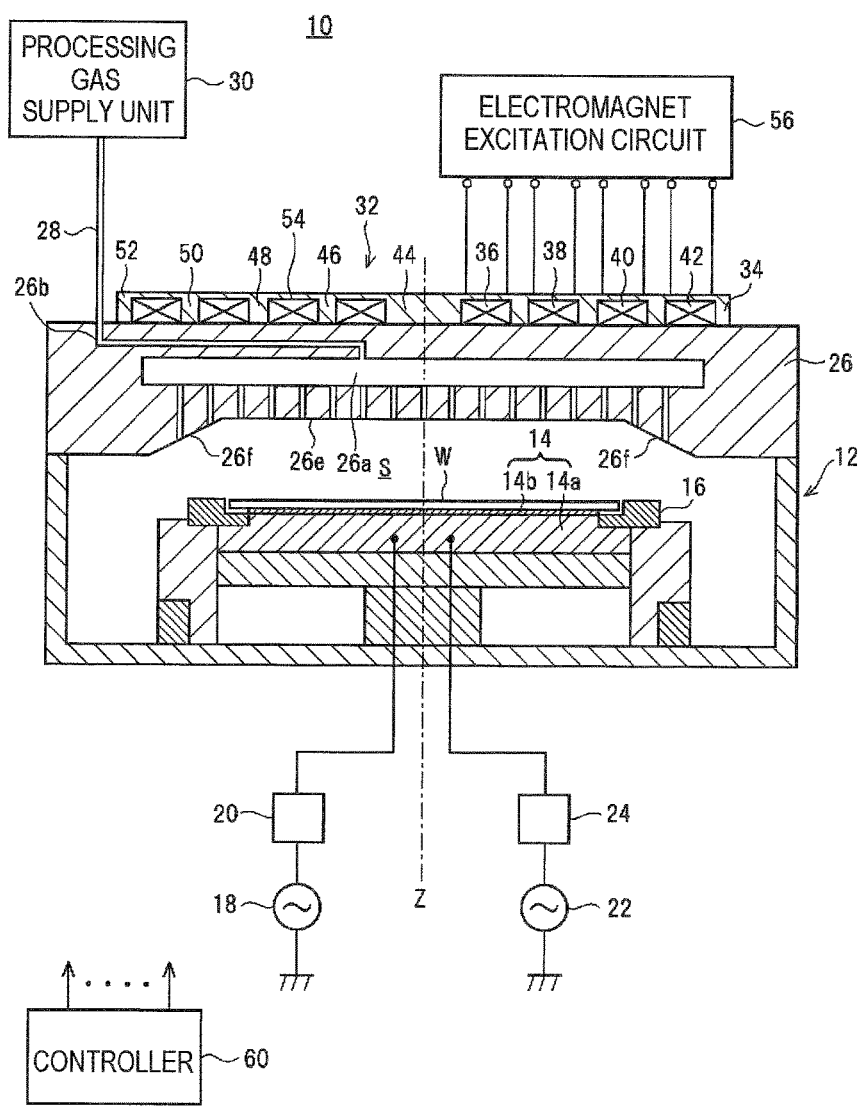
FIG. 9 is a schematic view illustrating an outlined configuration of a plasma processing apparatus according to a modification.

Hence, as a modification of the plasma etching apparatus of the exemplary embodiment (FIG. 1), for example, as illustrated in FIG. 9, the electromagnet 32 may be used efficiently to suppress generation of tilting in a case where the inter-electrode gap between the upper electrode 26 and the lower electrode (placing table) 14 is continuously changed in at least one site or one region in the radial direction.

In the example of FIG. 9, the inter-electrode gap between the upper electrode 26 and the lower electrode (placing table) 14 becomes narrower from the vicinity just above the edge of the 300 mm diameter semiconductor wafer W ($\varphi$=150 mm) toward the radial outside in a tapered form at a constant angle. The upper electrode 26 includes a first lower surface region 26e that faces the central portion of the semiconductor wafer W placed on the lower electrode (placing table) 14 in parallel, and a second lower surface region 26f that faces the peripheral portion of the semiconductor wafer W diagonally. In a case where the inter-electrode gap becomes narrower from the vicinity of the edge position of the semiconductor wafer W ($\varphi$=150 mm) toward the radial outside in a tapered form as described above, since the plasma density is relatively higher just below the second lower surface region 26f of the upper electrode 26, the interface between the ion sheath and the bulk plasma on the wafer W is inclined downward. Hence, the ratio of ions incident diagonally from the outside is increased in the region of the peripheral portion of the semiconductor wafer W. Thus, tilting in which the tilting angle becomes a negative value (inclined to the minus (−) direction in FIG. 4) is easily generated.

In this case, a configuration in which the third coil 40 in the electromagnet 32 as viewed from the central axis Z is selectively energized to form a magnetic field B in the processing space S, may be appropriately employed. In this case, as described above, when the coil 40 is energized to form a magnetic field B in the processing space S, a magnetic effect is exhibited to increase the plasma density in the region of the intermediate portion of the wafer offset radially inward from the coil 40 and decrease the plasma density in the region just below the coil 40. Accordingly, it is possible to flatten the interface between the ion sheath and the bulk plasma on the region of the peripheral portion of the semiconductor wafer W, and thus, make ions incident vertically on the surface of the wafer W, that is, suppress tilting. Therefore, the yield of the etching process on the semiconductor wafer W may be enhanced, and furthermore, the enhancement of the production efficiency and the reduction of the production cost may be achieved.

Figure 10:
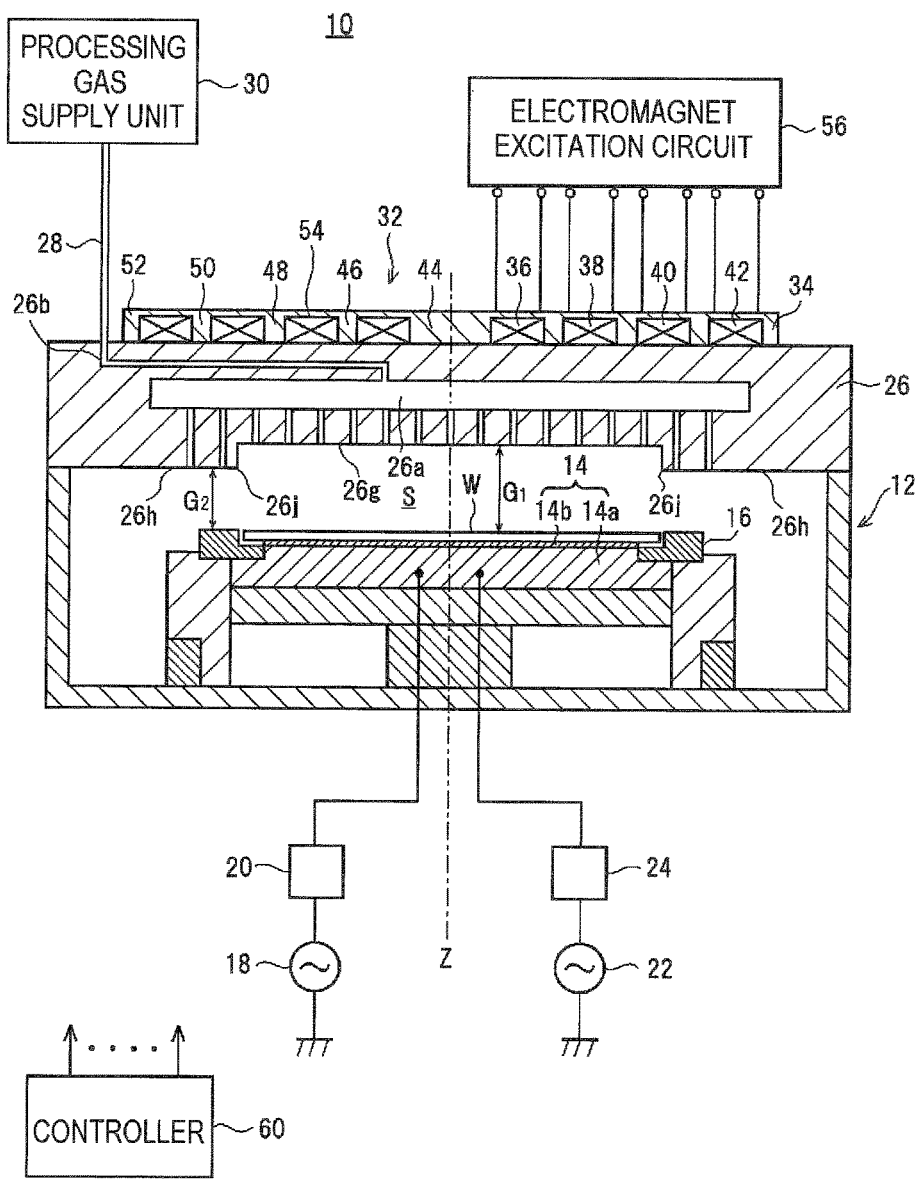
FIG. 10 is a schematic view illustrating an outlined configuration of a plasma processing apparatus according to another modification.

As another modification of the plasma etching apparatus of the exemplary embodiment (FIG. 1), as illustrated in FIG. 10, the electromagnet 32 may be used efficiently to suppress the generation of tilting as described above, even in a case where the inter-electrode gap between the upper electrode 26 and the lower electrode (placing table) 14 is changed stepwise in at least one site or one region in the radial direction.

In the example of FIG. 10, the upper electrode 26 includes a first lower surface region 26g that faces the semiconductor wafer W through a first gap G1, and a second lower surface region 26h that faces the semiconductor wafer W through a second gap G2 smaller than the first gap G1. Here, a boundary 26j between the first lower surface region 26g and the second lower surface region 26h is formed in the vicinity of the edge position of the semiconductor wafer W ($\varphi$=150 mm). Even in this case, since the inter-electrode gap becomes narrower in the vicinity of the edge position of the semiconductor wafer W ($\varphi$=150 mm), the interface between the ion sheath and the bulk plasma in the vicinity of the edge of the wafer W is inclined downward in the radial direction, and hence, the ratio of ions incident diagonally from the outside is increased. Thus, tilting in which the tilting angle becomes a negative value (inclined to the minus (−) direction in FIG. 4) is easily generated.

Also in this case, by adopting a configuration in which the third coil 40 in the electromagnet 32 as viewed from the central axis Z is selectively energized to form a magnetic field B in the processing space S, it is possible to flatten the interface between the ion sheath and the bulk plasma in the vicinity of the edge of the semiconductor wafer W, and thus, make ions incident vertically on the vicinity of the edge of the wafer W, that is, suppress tilting.

Another Exemplary Embodiment or Modification

The present disclosure is not limited to the above-described exemplary embodiments and examples, and various modifications may, of course, be made therein.

Specifically, besides the above-described exemplary embodiments, various embodiments may be made for the profile of the inter-electrode gap between the upper electrode 26 and the lower electrode (placing table) 14 or the unevenness shape of the lower surface of the upper electrode 26, and accordingly, various embodiments may also be made for the method of selectively energizing one or more coils among the coils 36, 38, 40, 42 in the electromagnet 32.

Figure 12:
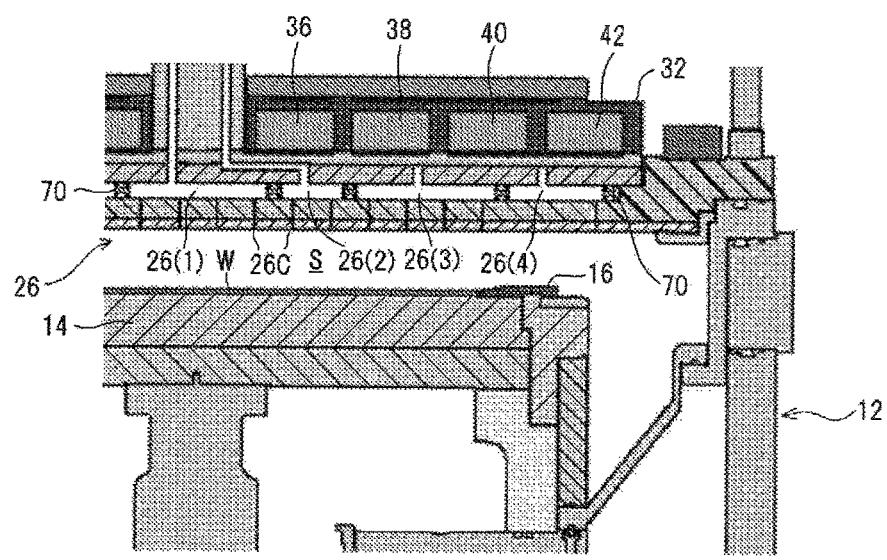
FIG. 12 is a schematic view illustrating an outlined configuration of a plasma processing apparatus according to yet another modification.

As described above, in the plasma processing apparatus of the present disclosure, the density distribution of the plasma generated in the processing space S of the chamber 12 may be controlled arbitrarily in the radial direction by selectively energizing the coils 36, 38, 40, 42 of the electromagnet 32. The plasma etching apparatus illustrated in FIG. 12 divides the gas buffer chamber of the shower head (upper electrode) 26 into a plurality of (e.g., four (4)) separate sub-gas chambers 26(1), 26(2), 26(3), 26(4) by an annular partition 70 in the radial direction in view of the plasma density controlling function of the electromagnet 32. In plan view, the sub-gas chamber 26(1) of the central portion is circular, and other sub-gas chambers 26(2), 26(3), 26(4) are distributed annularly with different diameters radially outside the sub-gas chamber 26(1) of the central portion. The separate sub-gas chambers 26(1), 26(2), 26(3), 26(4) are configured to introduce processing gases with independent gas species, mixing ratio and flow rate therefrom.

Therefore, when the same processing gases are supplied from the separate sub-gas chambers 26(1), 26(2), 26(3), 26(4) into the processing space S, the ratio of the respective gas flow rates may be controlled such that the density distribution of radicals generated in the coil processing space S is arbitrarily controlled in the radial direction, independent from the above-described magnetic effect. Accordingly, for example, the in-plane uniformity on the wafer may be easily enhanced with respect to the etching rate.

Figure 11:
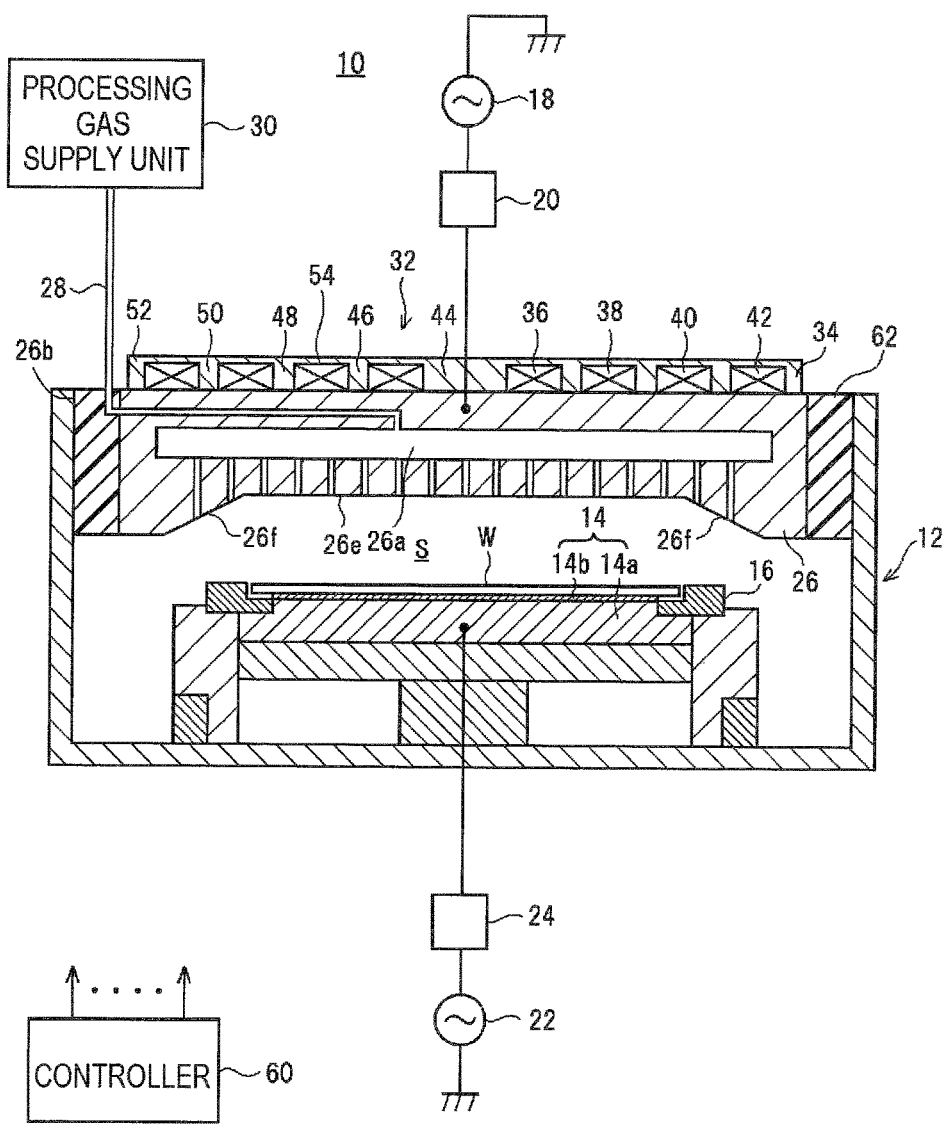
FIG. 11 is a schematic view illustrating an outlined configuration of a plasma processing apparatus according to still another modification.

The capacitively coupled plasma etching apparatus of the exemplary embodiment adopts a lower two-high frequency wave application system, in which the placing table (lower electrode) 14 within the chamber 12 is connected with the first high frequency power source 18 for plasma generation and the second high frequency power source 22 for ion attraction. However, as illustrated in FIG. 11, the present disclosure may be applied to a configuration in which the upper electrode 26 is connected with the first high frequency power source 18 for plasma generation and the placing table (lower electrode) 14 is connected with the second high frequency power source 22 for ion attraction.

The present disclosure is not limited to the plasma etching apparatus, but may also be applied to a capacitively coupled plasma CVD apparatus, plasma oxidizing apparatus, or plasma nitriding apparatus. Further, the processing target substrate is not limited to the semiconductor wafer, but may be various substrates for a flat panel display, an organic EL, or solar cell, or a photomask, a CD substrate, or a print substrate.

DESCRIPTION OF SYMBOL

10: plasma etching apparatus
12: chamber (processing container)
14: placing table
26: upper electrode
18: first high frequency power source (for plasma generation)
20: second high frequency power source (for ion attraction)
32: electromagnet
34: yoke member
36, 38, 40, 42: coil
44: columnar portion
46, 48, 50, 52: cylindrical portion
54: back plate portion
56: coil excitation circuit
60: controller

What is claimed is:

1. A plasma processing method for performing a processing on a substrate using a plasma processing apparatus the method comprising:
providing a focus ring in a peripheral edge region of a lower electrode of the plasma processing apparatus;
providing an electromagnet having one or more annular coils concentrically provided around a central axis that passes through a center of the lower electrode vertically in an upper portion or at an upper side of a processing container; and
applying plasma of a processing gas to the substrate while selectively energizing the one or more annular coils in the electromagnets to generate a magnetic field therearound in order to flatten a gradient of an interface between an ion sheath and bulk plasma formed on the substrate and on the focus ring such that ions from the plasma are substantially vertically incident to a surface of the substrate.

2. The plasma processing method of claim 1, wherein the selectively energizing the annular coils includes energizing an annular coil positioned at an outermost periphery of the electromagnet to generate a magnetic field therearound.

3. The plasma processing method of claim 1, wherein the processing performed on the substrate forms a trench on the substrate and a tilting angle of the trench is defined as an angle of a straight line connected from a center of an upper portion of the trench to a center of a bottom portion of the trench with reference to a perpendicular line drawn from the center of the upper portion of the trench.

4. The plasma processing method of claim 3, wherein the tilting angle is controlled according to a position of the one or more annular coils that is selected to be energized.

5. The plasma processing method of claim 3, wherein the tilting angle of the trench ranges from −2.3 degrees to 3.2 degrees.

6. The plasma processing method of claim 3, wherein when the tilting angle is a positive value, it is determined that the interface between the ion sheath and the bulk plasma is inclined upward in an outward radial direction, and when the tilting angle is a negative value, it is determined that the interface between the ion sheath and the bulk plasma is inclined downward in the outward radial direction.

* * * * *